United States Patent
Yang et al.

(10) Patent No.: US 8,829,548 B2
(45) Date of Patent: Sep. 9, 2014

(54) LIGHT EMITTING DEVICE PACKAGE AND FABRICATION METHOD THEREOF

(75) Inventors: Jong In Yang, Gyeonggi-do (KR); Sung Tae Kim, Seoul (KR); Yong Il Kim, Gyeonggi-do (KR); Su Yeol Lee, Gyeonggi-do (KR); Seung Wan Chae, Gyeonggi-do (KR); Hyung Duk Ko, Seoul (KR); Yung Ho Ryu, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/554,026

(22) Filed: Jul. 20, 2012

(65) Prior Publication Data

US 2013/0020598 A1 Jan. 24, 2013

(30) Foreign Application Priority Data

Jul. 20, 2011 (KR) .................. 10-2011-0071978

(51) Int. Cl.
*H01L 33/00* (2010.01)

(52) U.S. Cl.
USPC ..... 257/98; 257/99; 257/E29.335; 257/E21.356; 257/E25.032

(58) Field of Classification Search
CPC ..... H01L 33/60; H01L 33/648; H01L 33/641; H01L 33/64
USPC ........... 257/79, 80, 81, 82, 83, 84, 85, 86, 87, 257/88, 89, 90, 91, 92, 93, 94, 95, 96, 97, 257/98, 99, 100, 101, 102, 103, 621
See application file for complete search history.

(56) References Cited

U.S. PATENT DOCUMENTS

| | | | |
|---|---|---|---|
| 6,291,336 B1 * | 9/2001 | Teng | 438/627 |
| 7,154,149 B2 * | 12/2006 | Wu et al. | 257/355 |
| 7,518,158 B2 * | 4/2009 | Keller et al. | 257/98 |
| 8,410,513 B2 * | 4/2013 | Cho | 257/99 |

(Continued)

FOREIGN PATENT DOCUMENTS

| | | |
|---|---|---|
| KR | 10-0625600 B1 | 9/2006 |
| KR | 2008-0051877 A | 6/2008 |
| KR | 2010-0090980 A | 8/2010 |

OTHER PUBLICATIONS

Korean Office Action, and English translation thereof, issued in Korean Patent Application No. 10-2011-0071978 mailed Sep. 21, 2012.

(Continued)

*Primary Examiner* — Matthew W Such
*Assistant Examiner* — Samuel Lair
(74) *Attorney, Agent, or Firm* — McDermott Will & Emery LLP

(57) ABSTRACT

A light emitting device package includes: an undoped semiconductor substrate having first and second surfaces opposed to each other; first and second conductive vias penetrating the undoped semiconductor substrate; a light emitting device mounted on one region of the first surface; a bi-directional Zener diode formed by doping an impurity on the second surface of the undoped semiconductor substrate and having a Zener breakdown voltage in both directions; and first and second external electrodes formed on the second surface of the undoped semiconductor substrate such that they connect the first and second conductive vias to both ends of the bi-directional Zener diode region, respectively.

14 Claims, 4 Drawing Sheets

(56) References Cited

U.S. PATENT DOCUMENTS

| | | | |
|---|---|---|---|
| 8,410,514 B2* | 4/2013 | Kim | 257/99 |
| 2005/0139846 A1* | 6/2005 | Park et al. | 257/98 |
| 2009/0159918 A1* | 6/2009 | Keller et al. | 257/98 |
| 2009/0230878 A1* | 9/2009 | Naito et al. | 315/291 |
| 2010/0201280 A1* | 8/2010 | McKenzie et al. | 315/246 |
| 2010/0203657 A1 | 8/2010 | Kim | |
| 2010/0213498 A1* | 8/2010 | Kim | 257/99 |
| 2010/0295089 A1* | 11/2010 | Kim et al. | 257/99 |
| 2011/0057209 A1* | 3/2011 | Kim | 257/88 |
| 2012/0138996 A1* | 6/2012 | Keller et al. | 257/98 |
| 2012/0273940 A1* | 11/2012 | Jo | 257/737 |

OTHER PUBLICATIONS

Korean Office Action, w/ English translation thereof, issued in Korean Patent Application No. 10-2011-0071978 dated Feb. 27, 2013.

* cited by examiner

LIGHT EMITTING DEVICE PACKAGE AND FABRICATION METHOD THEREOF

CROSS-REFERENCE TO RELATED APPLICATIONS

This application claims the priority of Korean Patent Application No. 10-2011-0071978 filed on Jul. 20, 2011, in the Korean Intellectual Property Office, the disclosure of which is incorporated herein by reference.

BACKGROUND OF THE INVENTION

1. Field of the Invention

The present invention relates to a light emitting device package and a fabrication method thereof.

2. Description of the Related Art

In general, a nitride semiconductor material has been widely used in a green or blue light emitting diode (LED) or in a laser diode provided as a light source in a full-color display, an image scanner, various signaling systems, or in an optical communications device. A nitride semiconductor light emitting device may be provided as a light emitting device having an active layer emitting light of various colors, including blue and green, through the recombination of electrons and holes.

As remarkable progress has been made in the area of nitride semiconductor light emitting devices since they were first developed, the utilization thereof has been greatly expanded and research into utilizing semiconductor light emitting devices for the purpose of general illumination devices, as well as for light sources in electronic devices, has been actively undertaken. In particular, as information communication devices have tended to become smaller and thinner, various components thereof, such as resistors, condensers, noise filters, and the like, are increasingly reduced. Meanwhile, a light emitting diode (LED) is generally known to be vulnerable to an electrostatic discharge (ESD), so a Zener diode is connected in parallel to an LED chip to allow a current to flow in a reverse direction, thus dealing with ESD.

SUMMARY OF THE INVENTION

An aspect of the present invention provides a light emitting device package in which a surge current in both of a forward direction and a reverse direction is interrupted and electrostatic discharge (ESD) is effectively blocked.

Another aspect of the present invention provides a compact light emitting device package having enhanced heat dissipation efficiency.

Another aspect of the present invention provides a light emitting device package having enhanced luminance.

According to an aspect of the present invention, there is provided a light emitting device package including: an undoped semiconductor substrate having first and second surfaces opposed to each other; first and second conductive vias penetrating the undoped semiconductor substrate such that they connect the first and second surfaces; a light emitting device mounted on one region of the first surface and electrically connected to the first and second conductive vias, respectively; a bi-directional Zener diode formed by doping an impurity on the second surface of the undoped semiconductor substrate and having a Zener breakdown voltage in both directions; and first and second external electrodes formed on the second surface of the undoped semiconductor substrate such that they connect the first and second conductive vias to both ends of the bi-directional Zener diode region, respectively.

The first and second external electrodes may be formed to extend directly to the first and second conductive vias from one doped region of the bi-directional Zener diode, respectively.

The bi-directional Zener diode region may be formed to be spaced apart from the first and second conductive vias.

The bi-directional Zener diode region may be positioned between the first and second conductive vias.

The light emitting device package may further include: first and second surface electrodes formed on the first surface of the undoped semiconductor substrate and electrically connecting the light emitting device to the first and second conductive vias, respectively.

The light emitting device may be bonded to the first and second surface electrodes through flip-chip bonding.

The first surface of the undoped semiconductor substrate may include a recess portion having sloped side walls therein, and the first and second surface electrodes may be formed to extend to the side walls of the recess portion.

The light emitting device may be disposed within the recess portion, and the recess portion may be filled with a light-transmissive resin.

The light-transmissive resin may include a wavelength conversion material for converting a wavelength of light emitted from the light emitting device.

The bi-directional Zener diode may be formed as a region of the second surface of the undoped semiconductor substrate is doped to have a first type of conductivity and both sides in contact with the doped region are doped to have a second type of conductivity.

Both electrodes of the light emitting device may be electrically connected to the regions of the bi-directional Zener diode doped to have the second type of conductivity.

The bi-directional Zener diode may be an npn or pnp Zener diode.

According to an aspect of the present invention, there is provided a method for fabricating a light emitting device package, including: preparing an undoped semiconductor substrate having first and second surfaces opposed to each other; forming first and second conductive vias penetrating the undoped semiconductor substrate such that they connect the first and second surfaces; doping the second surface of the undoped semiconductor substrate with an impurity to form a bi-directional Zener diode having a Zener breakdown voltage in both directions; forming first and second external electrodes on the first surface of the undoped semiconductor substrate such that they connect the first and second conductive vias to both ends of the bi-directional Zener diode, respectively; and mounting a light emitting device on the first surface of the undoped semiconductor substrate such that the light emitting device is electrically connected to the first and second conductive vias, respectively.

The first and second external electrodes may be formed to extend directly to the first and second conductive vias from one doped region of the bi-directional Zener diode, respectively.

The bi-directional Zener diode region may be formed to be spaced apart from the first and second conductive vias.

The bi-directional Zener diode region may be positioned between the first and second conductive vias.

The method may further include: forming first and second surface electrodes on the first surface of the undoped semiconductor substrate to electrically connect the light emitting device to the first and second conductive vias, respectively.

In the disposing of the light emitting device, the light emitting device may be bonded to the first and second surface electrodes through flip-chip bonding.

The method may further include: forming a recess portion having sloped side walls therein on the first surface of the undoped semiconductor substrate, wherein and the first and second surface electrodes may be formed to extend to the side walls of the recess portion.

The method may further include: disposing the light emitting device within the recess portion and filling the recess portion with a light-transmissive resin.

In the forming of the bi-directional Zener diode, the bi-directional Zener diode may be formed by doping a region of the second surface of the undoped semiconductor substrate to have a first type of conductivity and doping both sides in contact with the doped region to have a second type of conductivity.

The forming of the first and second conductive vias may include: forming a through hole penetrating the undoped semiconductor substrate and filling the interior of the through hole with a conductive material.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
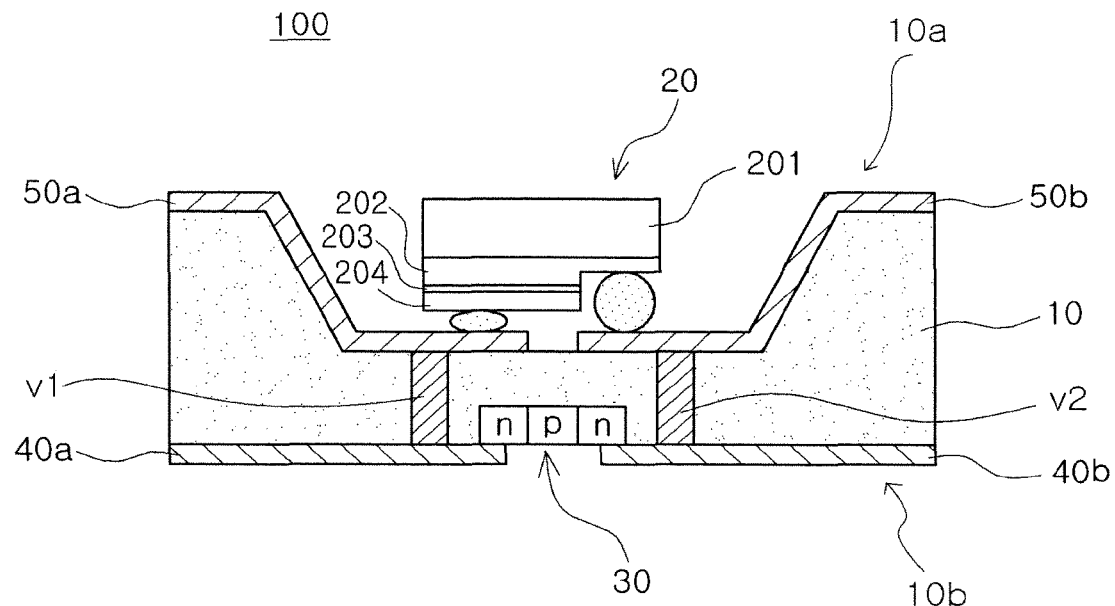
FIG. 1 is a schematic sectional view of a light emitting device package according to an embodiment of the present invention.

Embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

FIG. 1 is a schematic sectional view of a light emitting device package according to an embodiment of the present invention. A light emitting device package 100 according to the present embodiment may include an undoped semiconductor substrate 10 having first and second surfaces 10a and 10b opposed to each other, first and second conductive vias v1 and v2 penetrating the undoped semiconductor substrate 10, a light emitting device 20 electrically connected to the first and second conductive vias v1 and v2, respectively, a bi-directional Zener diode formed on the second surface 10b of the undoped semiconductor substrate, and first and second external electrodes 40a and 40b formed on the second surface 10b of the undoped semiconductor substrate. The first and second conductive vias v1 and v2 may connect the first and second surfaces 10a and 10b of the undoped semiconductor substrate 10, and the first and second external electrodes 40a and 40b may connect the first and second conductive vias v1 and v2 to both ends of the bi-directional Zener diode 30 region. The bi-directional Zener diode 30 may be formed by doping an impurity in the second surface 10b of the undoped semiconductor substrate 10 and have a Zener breakdown voltage in both directions.

In the present embodiment, the light emitting device 20 may have a structure including a first conductivity-type semiconductor layer 202, an active layer 203, and a second conductivity-type semiconductor layer 204. The first and second conductivity-type semiconductor layers 202 and 204 may be n-type and p-type semiconductor layers, respectively, and may be made of a nitride semiconductor. The first and second conductivity-type semiconductor layers 202 and 204 may be made of a material expressed by an empirical formula $Al_xIn_yGa_{(1-x-y)}N$ (here, $0 \leq x \leq 1$, $0 \leq y \leq 1$, $0 \leq x+y \leq 1$), and such a material may include GaN, AlGaN, InGaN, and the like.

The active layer 22 disposed between the first and second conductivity-type semiconductor layers 21 and 23 emits light having a certain level of energy according to electron and hole recombination, and may have a multi-quantum well (MQW) structure in which a quantum well and a quantum barrier are alternately laminated. Here, the MQW structure may be, for example, an InGaN/GaN structure.

The undoped semiconductor substrate 10 may be an insulating or semi-insulating semiconductor substrate and may be able to prevent defects caused by a short-circuit or a leakage current between the bi-directional Zener diode 30 formed on the second surface 10b and the light emitting device 20 disposed on the first surface 10a. Also, since a portion of the undoped semiconductor substrate 10, e.g., a silicon substrate, is doped with an impurity and the bi-directional Zener diode 30 is formed on the second surface 10b, an additional space for installing the Zener diode 30 is not required, which is, thus, advantageous for reducing the size of the package.

The first and second conductive vias v1 and v2 may be formed to penetrate the undoped semiconductor substrate 10. The first and second conducive vias v1 and v2 connect the first surface 10a of the undoped semiconductor substrate 10 and the second surface 10b positioned in the opposite side of the first surface 10a, and are formed as at least a pair conductive vias electrically separated from each other so as to be connected to both electrodes of the light emitting device 20. The first and second conductive vias v1 and v2 may be made of a known metal having electrical conductivity, and may have a structure in which aluminum (Al), titanium (Ti), platinum (Pt), and titanium (Ti) (i.e., Al/Ti/Pt/Ti) are sequentially laminated. The number, shape, pitch, and the like, of the conductive vias v1 and v2 may appropriately be changed as necessary. The conductive vias v1 and v2 electrically connect the light emitting device 20 to the bi-directional Zener diode 30 disposed on the first and second surfaces 10a and 10b, respectively, and effectively dissipate heat generated from the light emitting device 20 to the outside.

The bi-directional Zener diode 30 having a Zener breakdown voltage in both directions may be formed on the second surface 10b of the undoped semiconductor substrate by doping a portion of the second surface 10b with an impurity. In detail, a portion of the second surface 10b of the undoped semiconductor substrate is doped to have a first type of conductivity and both lateral portions thereof are doped to have a second type of conductivity such that they are in contact with the region doped to have the first type of conductivity, thus constituting the bi-directional Zener diode. Here, the first and second conductivity-types may be an n type or a p type, respectively. The bi-directional Zener diode 30 region may be separated from the first and second conductive vias v1 and v2 and disposed between the first and second conductive vias v1 and v2. The npn or pnp bi-directional Zener diode formed on the second surface 10b of the undoped semiconductor substrate may effectively prevent electrostatic discharge (ESD) by interrupting a surge current in both of a forward direction and a reverse direction.

In case of connecting the bi-directional Zener diode 30 to the light emitting device 20, since the polarities of two terminals of the bi-directional Zener diode are the same, so the bi-directional Zener diode 30 may be connected in parallel to the light emitting device 20 regardless of the polarity of the light emitting device 20 intended for enhancing a withstand voltage. When a surge voltage is applied in a forward direction or reverse direction to the light emitting device 20 to which the bi-directional Zener diode 30 is connected, a Zener breakdown is generated in the vicinity of a Zener voltage, making an overcurrent flow toward the Zener diode 30 having a small resistance value, rather than toward the device vulnerable to static electricity. Thus, the device can be prevented from being damaged or broken down when an overvoltage or an overcurrent is applied, regardless of the direction.

The first and second external electrodes 40a and 40b may be formed on the second surface 10b of the undoped semiconductor substrate and connect the bi-directional Zener diode 30 to the first and second conductive vias v1 and v2. The first and second external electrodes 40a and 40b may be electrically separated from each other and may extend directly from doped regions of the bi-directional Zener diode 30 to the first and second conductive vias v1 and v2, respectively. Namely, the first and second external electrodes 40a and 40b may connect the first and second conductive vias v1 and v2 extending to the second surface 10b of the undoped semiconductor substrate to the regions (n) doped to have the second type of conductivity at both sides in contact with the region (p) doped to have the first type of conductivity to serve as terminals, on the second surface 10b of the undoped semiconductor substrate, for receiving an electrical signal from the outside.

The first and second external electrodes 40a and 40b may be mounted such that they are directly in contact with a circuit board (not shown) having a wiring structure, and in this case, the first and second external electrodes 40a and 40b serve to transmit heat generated from the light emitting device 20 to the outside through the first and second conductive vias v1 and v2, so the first and second external electrodes 40a and 40b may be made of a metal having excellent electrical conductivity and heat conductivity. The first and second external electrodes 40a and 40b may include a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), copper (Cu), or the like, but are not limited thereto.

The light emitting device package 100 may further include first and second surface electrodes 50a and 50b disposed on the first surface 10a of the undoped semiconductor substrate, on which the light emitting device 20 is disposed, and to electrically connect the light emitting device 20 to the first and second conductive vias v1 and v2. The first and second surface electrodes 50a and 50b may be connected to both terminals of the light emitting device 20 to transmit an external electrical signal applied from the first and second external electrodes 40a and 40b to the light emitting device 20 through the first and second conductive vias v1 and v2. As shown in FIG. 1, the light emitting device 20 may be bonded to the first and second surface electrodes 50a and 50b through flip-chip bonding, and in this case, since a wire bonding process is omitted, the process and structure can be simplified, and also, since a quantity of light otherwise absorbed by a wire is reduced, light extraction efficiency can be improved.

The first surface 10a of the undoped semiconductor substrate may include a recess portion having sloped side walls therein, and the light emitting device 20 may be disposed within the recess portion. The first and second surface electrodes 50a and 50b may be formed to extend to the side walls of the recess portion and, in this case, the first and second surface electrodes 50a and 50b may be electrically connected to the first and second conductive vias v1 and v2 to provide a mounting region for the light emitting device 20 and have a reflective structure allowing light emitted from the active layer 203 of the light emitting device 20 to be reflected from the side walls of the recess portion so as to be collected upwardly, thus enhancing light extraction efficiency. To this end, the first and second surface electrodes 50a and 50b may include a material such as silver (Ag), nickel (Ni), aluminum (Al), rhodium (Rh), palladium (Pd), iridium (Ir), magnesium (Mg), zinc (Zn), platinum (Pt), gold (Au), or the like, to have an advantage of light reflection, and may have a structure including two or more layers to enhance reflecting efficiency. For example, the first and second surface electrodes 50a and 50b may have a structure of Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like, but the present invention is not limited thereto.

In the light emitting device package 100 according to the present embodiment, the bi-directional Zener diode 30 is formed by doping an impurity on the second surface 10b of the undoped semiconductor substrate. Thus, an additional area for mounting the Zener diode 30 is not required, obtaining an effect of being advantageous for reducing the package in size. Also, since the bi-directional Zener diode 30 is positioned on the surface, i.e., the second surface 10b, opposed to the surface on which light emitting device 20 of the undoped semiconductor substrate 10 is mounted, a problem in which luminance is degraded as a partial amount of light emitted from the light emitting device 20 is absorbed by the Zener diode 30 can be solved. Also, since a bonding wire vulnerable to high temperatures is omitted and the electrical connection structure is formed between the light emitting device 20 and the bi-directional Zener diode 30 by using the first and second conductive vias v1 and v2 and the first and second external electrodes 40a and 40b, reliability of the package can be improved and heat dissipation efficiency can be enhanced.

Figure 2:
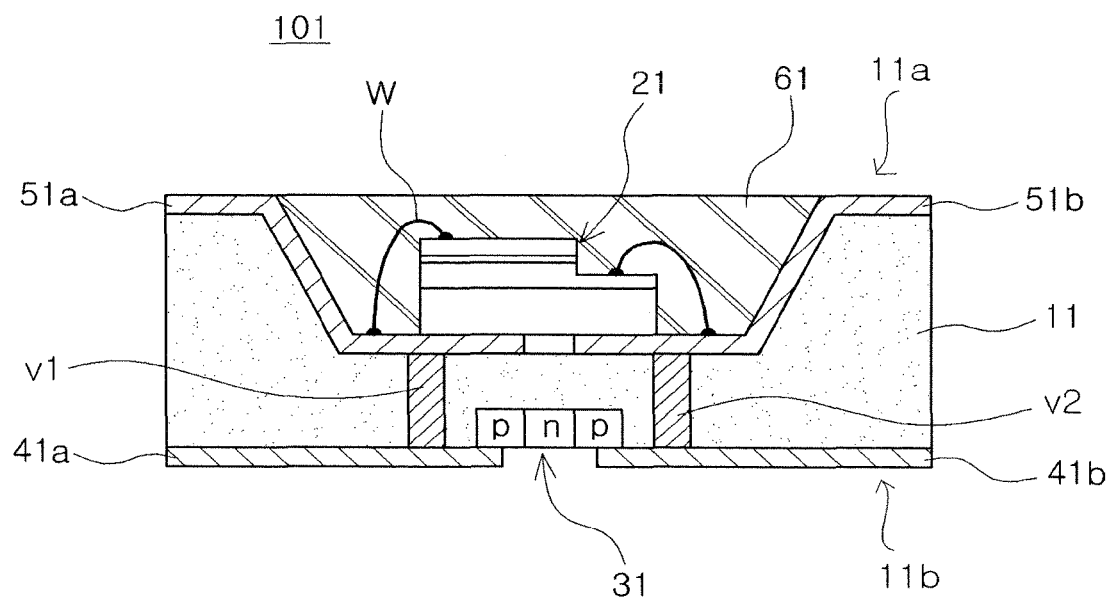
FIG. 2 is a schematic sectional view of a light emitting device package according to another embodiment of the present invention.

FIG. 2 is a schematic sectional view of a light emitting device package according to another embodiment of the present invention. A light emitting device package 101 according to the present embodiment may include a light emitting device 21 disposed on a first surface 11a of an undoped semiconductor substrate, a bi-directional Zener diode 31 formed by doping an impurity on a second surface 11b of the undoped semiconductor substrate 11, and first and second external electrodes 41a and 41b formed on the second surface 11b of the undoped semiconductor substrate 11. Like the embodiment illustrated in FIG. 1, the first and second external electrodes 41a and 41b electrically connect the bi-directional Zener diode 31 to the first and second conductive vias v1 and v2, and the light emitting device 21 may be electrically connected to the first and second external electrodes 41a and 41b through the first and second conductive vias v1 and v2.

In the present embodiment, unlike the embodiment illustrated in FIG. 1, the light emitting device 21 may be electrically connected to first and second surface electrodes 51a and 51b formed on the first surface 11a of the undoped semiconductor substrate through conductive wires W. In the present embodiment, a pair of electrodes (not shown) are positioned on upper portions so as to be connected to the light emitting device 21, and are connected to the first and second surface electrodes 51a and 51b through a pair of wires W, but a connection scheme may vary according to embodiments. For example, the light emitting device 21 may be mounted on the first surface electrode 51a and directly electrically connected to the first surface electrode 51a without using a wire while being connected to the second surface electrode 51b by a conductive wire W.

Meanwhile, the first surface 11a of the undoped semiconductor substrate, on which the light emitting device 21 is disposed, may include a recess portion in which the light emitting device 21 is disposed, and may be filled with a light-transmissive resin 61. The light-transmissive resin 61 may be formed to hermetically seal the light emitting device 21 in a path of light emitted from the light emitting device 21. In detail, the resin may be configured as a transparent resin including any one of epoxy, silicon, strained silicon, an urethane resin, an oxetane resin, acryl, polycarbonate, and polyimide, protect the light emitting device 21 and the conductive wires W, and implement refractive index matching between a material used to form the light emitting device 21 and the outside to enhance external light extraction efficiency. Also, depressions and protrusions may be formed on the surface of the light-transmissive resin 61 to increase light extraction efficiency and adjust a direction of emitted light.

Although not shown, the light-transmissive resin 61 may include wavelength conversion phosphor particles or quantum dots for converting a wavelength of light emitted from the active layer of the light emitting device 21. The phosphor may be a phosphor converting a wavelength of light into any one of yellow, red, and green, or a plurality types of phosphors may be mixed to convert light into a plurality of wavelengths. The type of phosphors may be determined by a wavelength emitted from the active layer of the light emitting device 21. In detail, the wavelength conversion material may include at least one or more phosphor materials among a YAG-based phosphor material, a TAG-based phosphor material, a silicate-based phosphor material, a sulfide-based phosphor material, and a nitride-based phosphor material. For example, when a phosphor for performing wavelength conversion to yellow light is applied to a blue LED chip, a white semiconductor light emitting device may be obtained.

A quantum dot is a nano crystal of a semiconductor material having a diameter ranging from about 1 nm to 10 nm, exhibiting a quantum confinement effect. The quantum dots convert the wavelength of light emitted from the light emitting device 21 to generate wavelength-converted light, namely, fluorescence. The quantum dot may be, for example, an Si-based nano crystal, a group II-IV compound semiconductor nano crystal, a group III-V compound semiconductor nano crystal, a group IV-VI compound semiconductor nano crystal, or the like, and in the present exemplary embodiment, these nano crystals may be used alone as the quantum dot or a mixture thereof may be used.

Referring to the quantum dot material, the group II-VI-based compound semiconductor nano crystal may be, for example, any one selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, and HgZnSTe. The group III-V-based compound semiconductor nano crystal may be, for example, any one selected from the group consisting of GaN, GaP, GaAs, AlN, Alp, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The group IV-VI-based compound semiconductor nano crystal may be, for example, SbTe.

The quantum dots may be distributed in the form of being naturally coordinated in a dispersive medium such as an organic solvent or a polymer resin. Any medium may be used as the dispersive medium as long as it is a transparent material which does not affect the wavelength conversion performance of the quantum dots, is not denatured by light or does not reflect light, and does not cause light absorption. For example, the organic solvent may include at least one of toluene, chloroform, and ethanol, and the polymer resin may include at least one of epoxy, silicon, polystyrene, and acrylate.

FIGS. 3 through 6 are sectional views showing a method for fabricating a light emitting device package according to an embodiment of the present invention. Specifically, FIGS. 3 through 6 show a method for fabricating the light emitting device package 100 according to an embodiment illustrated in FIG. 1. First, with reference to FIG. 3, through holes h penetrating the undoped semiconductor substrate 10 having the first and second surfaces 10a and 10b opposed to each other may be formed. The through holes h are provided for forming the first and second conductive vias v1 and v2 electrically connected to both electrodes of the light emitting device, and may be configured as a pair. The through holes h may be formed by using an etching process using a mask.

In detail, a wet etching method using a buffered oxide etchant (BOE) solution as an etching solution may be used, or a reactive ion etching (RIE) dry etching method may be used. In a wet etching step, any one of hydrochloric acid (HCL), nitric acid ($HNO_3$), hydrofluoric acid (HF), potassium hydroxide (KOH), sodium hydroxide (NaOH), sulfuric acid ($H_2SO_4$), phosphoric acid ($H_3PO_4$), and alu-etch ($4H_3PO_4$+ $4CH_3COOH+HNO_3+H_2$), or a mixture solution obtained by compounding (or mixing) them may be used as an etching solution. Here, the etching solution may be heated to reach a temperature of 100☐ or higher so as to be used. Meanwhile, in the dry etching, at least one of $BCL_3$, $Cl_4$, HBr, and Ar may be used as an etching gas, and in etching the undoped semiconductor substrate 10, both the dry etching and wet etching may be performed together.

Figure 3:
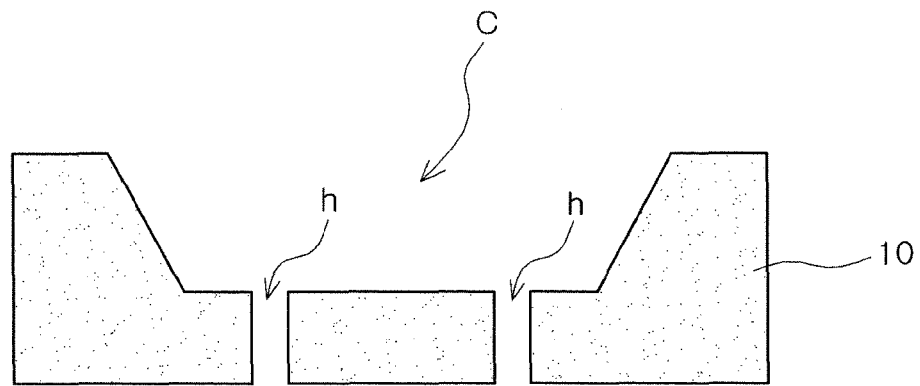
FIGS. 3 through 6 are sectional views showing a method for fabricating a light emitting device package according to an embodiment of the present invention.

Meanwhile, the recess portion C may be formed on the first surface 10a of the undoped semiconductor substrate, and, as shown in FIG. 3, when the side walls of the recess portion C have a sloped structure, light emitted from the light emitting device disposed within the recess portion C may be guided upwardly, enhancing external light extraction efficiency. The recess portion C may be formed before or after the formation of the through holes h, and here, a wet or dry etching process using a mask as described above in the through hole h formation process may be applied, but the present invention is not limited thereto.

Figure 4:
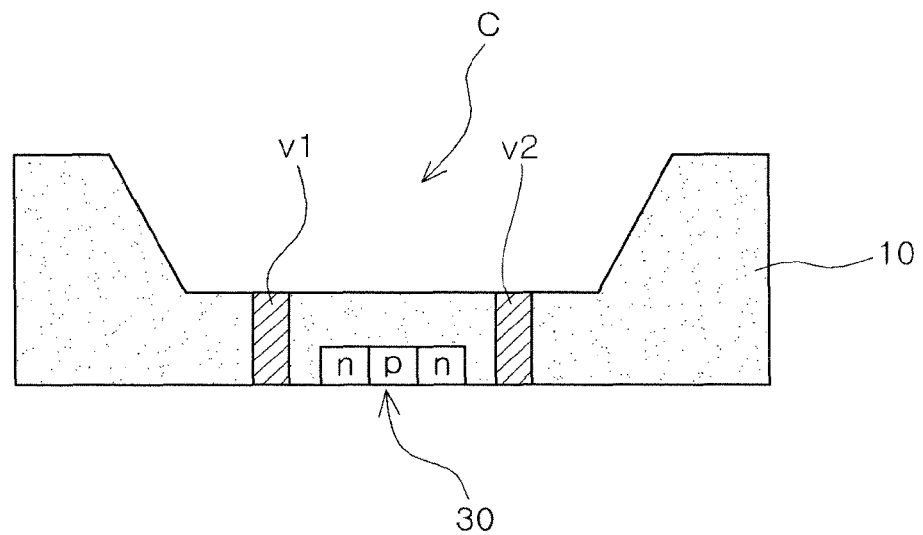

Next, as shown in FIG. 4, the interior of the through holes h are filled with a conductive material to form the first and second conductive vias v1 and v2. The first and second conductive vias v1 and v2 electrically connect the second surface 10b of the undoped semiconductor substrate and the first surface 10a positioned on the opposite surface to that of the second surface 10b and fill the through holes h. Here, the interior of the through holes h may not necessarily be filled with a conductive material to form the first and second conductive vias v1 and v2 and only a portion of the interior of the through holes h may be filled with a conductive material as long as the first and second conductive vias v1 and v2 can electrically connect the first and second surfaces 10a and 10b. The first and second conductive vias v1 and v2 may be formed through injection, spreading, plating, or the like, and may be made of a metal, such as, for example, aluminum (Al), copper (Cu), titanium (Ti), platinum (Pt), having excellent heat conductivity and electrical conductivity, or an alloy thereof.

Meanwhile, a portion of the second surface 10b of the undoped semiconductor substrate may be doped with an impurity to form the bi-directional Zener diode 30 having a Zener breakdown voltage in both directions. In detail, a region of the undoped semiconductor substrate 10 is doped to have a first conductivity (a p type or an n type of conductivity), and portions at both sides thereof in contact with the region doped to have the first type of conductivity (a p type or an n type of conductivity) are doped to have a second type of conductivity (an n type or a p type), thus forming the npn or pnp bi-directional Zener diode 30. The impurity doping may be performed through a process of injecting and spreading an n-type or p-type impurity, and in the case of the silicon substrate, arsenic (As) may be applied as an example of the n-type impurity and boron (B) may be applied as an example of the p-type impurity.

Figure 5:
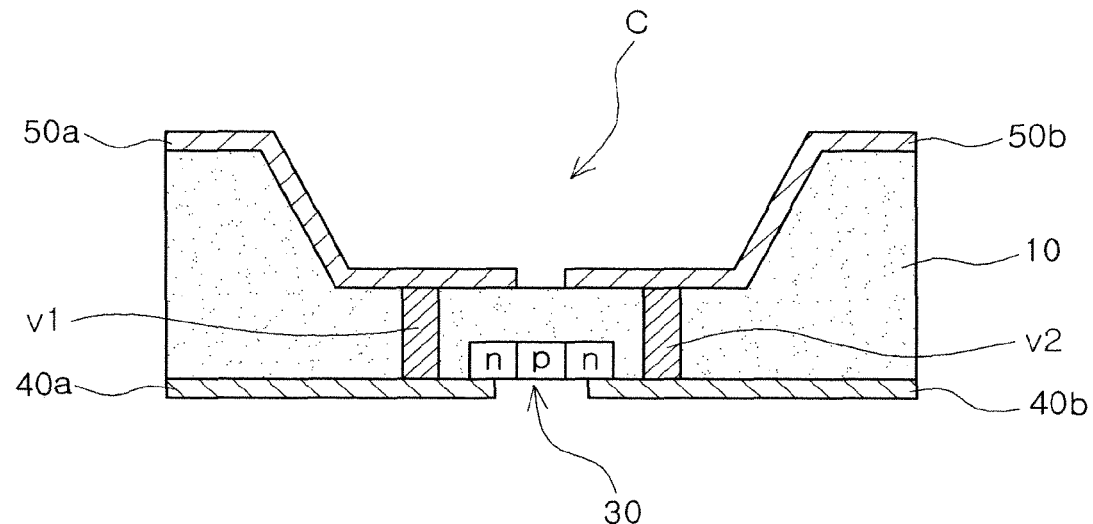

Thereafter, with reference to FIG. 5, the first and second external electrodes 40a and 40b may be formed on the second surface 10b of the undoped semiconductor substrate to electrically connect the first and second conductive vias v1 and v2 to the bi-directional Zener diodes 30. The first and second external electrodes 40a and 40b may be formed to extend directly from the regions n doped to have the second type of conductivity of the bi-directional Zener diode formed on the second surface 10b of the undoped semiconductor substrate to the first and second conductive vias v1 and v2. The first and second external electrodes 40a and 40b may be electrically separated from each other, serve as connection terminals for receiving an electrical signal from the outside, and perform a heat dissipation function of dissipating heat transmitted from the light emitting device through the first and second conductive vias v1 and v2 to the outside. To this end, the first and second external electrodes 40a and 40b may be made of a metal having excellent electrical conductivity and heat conductivity. For example, the first and second external electrodes 40a and 40b may include a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), copper (Cu), or the like.

The first and second surface electrodes 50a and 50b may be formed on the first surface 10a, namely, on the region in which the recess portion C is formed, of the undoped semiconductor substrate. The first and second surface electrodes 50a and 50b may electrically connect the first and second conductive vias v1 and v2 to a light emitting device (not shown) to be disposed in the recess portion C. When the recess portion C formed on the first surface 10a of the undoped semiconductor substrate has sloped side walls as shown in FIG. 5, the first and second surface electrodes 50a and 50b may extend to the side walls of the recess portion C to form a light reflective structure. Here, the first and second surface electrodes 50a and 50b may include a material such as (Ag), nickel (Ni), aluminum (Al), rhodium (Rh), palladium (Pd), iridium (Ir), magnesium (Mg), zinc (Zn), platinum (Pt), gold (Au), or the like, and may have a structure including two or more layers to enhance reflecting efficiency. For example, the structure may include Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like, but the present invention is not limited thereto.

Figure 6:
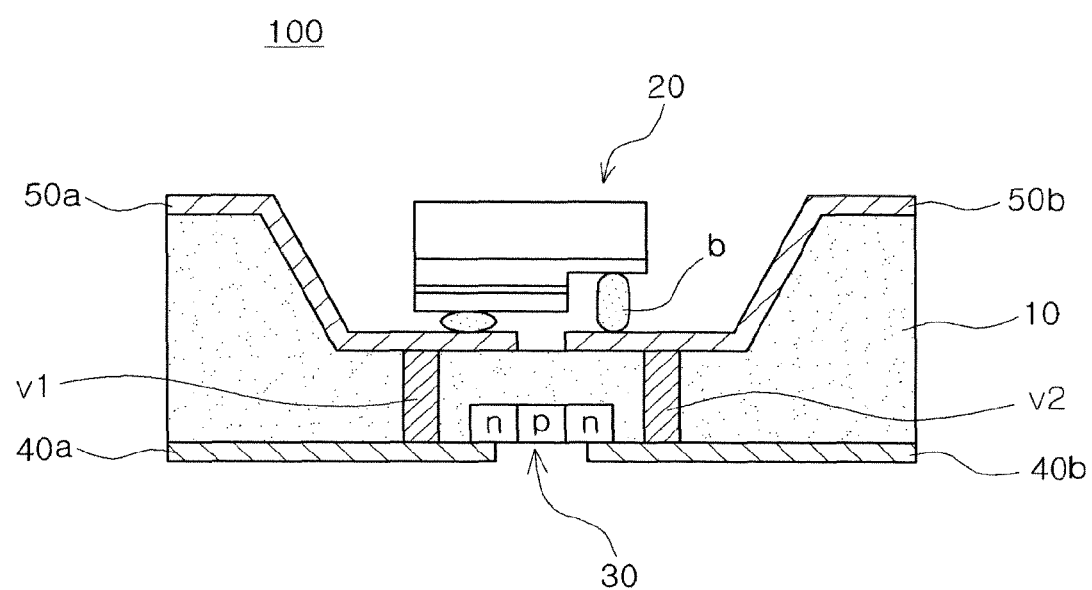

Thereafter, as shown in FIG. 6, the light emitting device 20 may be disposed within the recess portion C formed on the first surface 10a of the undoped semiconductor substrate. The light emitting device 20 may be bonded with the first and second surface electrodes 50a and 50b through bump pads b through flip-chip bonding, and in this case, since a wire bonding structure is omitted, reliability of the light emitting device package can be enhanced. However, the mounting scheme of the light emitting device according to an embodiment of the present invention is not limited thereto and it could be obvious for a person skilled in the art that a bonding scheme using a wire is also applicable.

Meanwhile, although not shown, a light-transmissive resin (not shown) may be applied to the recess portion C of the undoped semiconductor substrate 10, and the light-transmissive resin may further include a wavelength conversion material such as phosphors, quantum dots, or the like. The light-transmissive resin may be formed to hermetically seal the light emitting device in a path of light emitted from the light emitting device. In detail, the resin may be configured as a transparent resin including at least any one of epoxy, silicon, strained silicon, an urethane resin, an oxetane resin, acryl, polycarbonate, and polyimide. The light-transmissive resin may protect the light emitting device 20 and implement refractive index matching between a material used to form the light emitting device 20 and the outside to enhance external light extraction efficiency. Also, depressions and protrusions may be formed on the surface of the light-transmissive resin to increase light extraction efficiency and adjust a direction of emitted light.

Figure 7A:
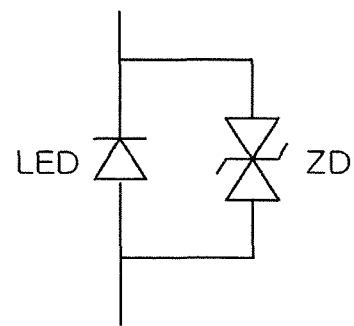
FIGS. 7A and 7B are a circuit diagram of a bi-directional Zener diode and a schematic view showing a change in current over voltage when the bi-directional Zener diode is employed according to an embodiment of the present invention.
Figure 7B:
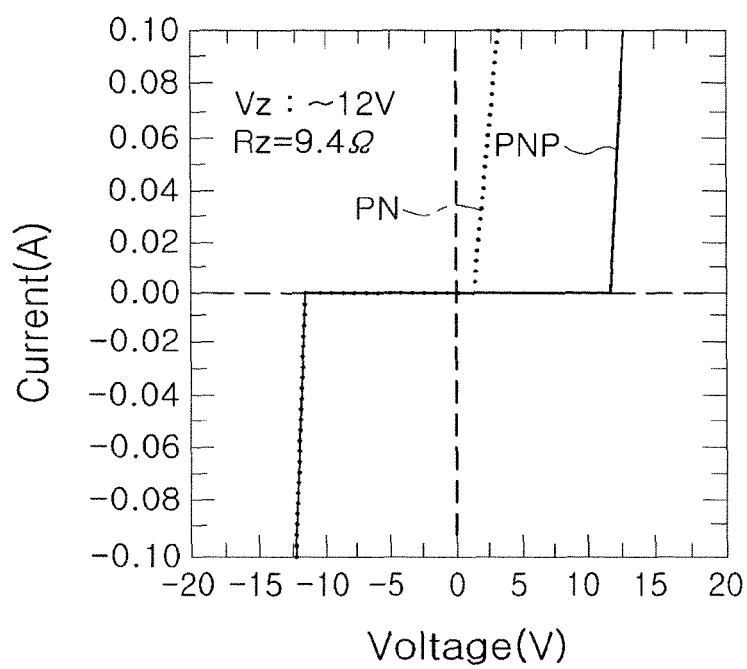

FIGS. 7A and 7B are a circuit diagram of a bi-directional Zener diode and a schematic view showing a change in current over voltage when the bi-directional Zener diode is employed according to an embodiment of the present invention. Specifically, FIG. 7A is an equivalent circuit diagram in which a light emitting device (LED) and a bi-directional Zener diode (ZD) are connected in parallel, showing a circuit structure of the light emitting device 20 and the bi-directional Zener diode 30 in the light emitting device package 100. FIG. 7B is a graph of changes in electrical currents over voltages of the Zener diode having a general PN junction structure (indicated by the dotted line) and the bi-directional Zener diode having the PNP junction structure (indicated by the solid line)

With reference to FIG. 7B, in the case of the Zener diode having a general PN junction structure (indicated by the dotted line), Zener breakdown is generated only in a reverse direction, so a current flows through the Zener diode only when a high voltage (−12V or higher) is applied in the reverse direction, and thus, if a high voltage is applied in a forward direction, the relevant device cannot be sufficiently protected. However, in the case of the bi-directional Zener diode (ZD) (indicated by the solid line), since it has a Zener breakdown voltage Vz of about ±12V, a current does not flow when the light emitting device (LED) is normally operated in a forward direction, and when a high voltage is suddenly applied in the forward direction or reverse direction, Zener breakdown is generated to allow the current to flow toward the Zener diode (ZD) having a low resistance value, whereby the light emitting device (LED) can be effectively prevented from being damaged.

As set forth above, according to embodiments of the invention, since the bi-directional Zener diode is formed by doping an impurity to a portion of the second surface of the undoped semiconductor substrate, an area for mounting the Zener diode is not additionally required, obtaining an effect of being advantageous for reducing the package in size.

In addition, since the Zener diode is positioned on the opposite side of the surface on which the light emitting device is mounted, a problem in which an amount of light emitted from the light emitting device is absorbed by the Zener diode to degrade luminance can be solved.

A light emitting device package capable of effectively interrupting a surge current in both of the forward and reverse directions by using the bi-directional Zener diode and effectively preventing electrostatic discharge (ESD) can be provided.

In addition, since the electrical connection structure is formed by using the conductive vias and electrodes, omitting a bonding wire vulnerable to high temperatures, reliability of the package can be improved and heat dissipation efficiency can be enhanced.

While the present invention has been shown and described in connection with the embodiments, it will be apparent to those skilled in the art that modifications and variations can be made without departing from the spirit and scope of the invention as defined by the appended claims.

What is claimed is:

1. A light emitting device package comprising:
   an undoped semiconductor substrate having first and second surfaces opposed to each other;
   first and second conductive vias penetrating the undoped semiconductor substrate such that they connect the first and second surfaces;
   a light emitting device mounted on one region of the first surface and electrically connected to the first and second conductive vias, respectively;
   a bi-directional Zener diode formed by doping an impurity on the second surface of the undoped semiconductor substrate and having a Zener breakdown voltage in both directions;
   first and second external electrodes disposed on the second surface of the undoped semiconductor substrate such that they connect the first and second conductive vias to both ends of the bi-directional Zener diode region, respectively; and
   first and second surface electrodes disposed on the first surface of the undoped semiconductor substrate and electrically connecting the light emitting device to each of the first and second conductive vias,
   wherein each of the first and second conductive vias are formed of sequentially laminated layers of metals,
   wherein the first surface of the undoped semiconductor substrate includes a recess portion having sloped side walls therein, and the first and second surface electrodes extend along the side walls of the recess portion, and
   wherein each of the first and second conductive vias is formed of layers of aluminum (Al), titanium (Ti), platinum (Pt), and titanium (Ti) that are sequentially laminated in the order Al/Ti/Pt/Ti.

2. The light emitting device package of claim 1, wherein the first and second external electrodes are disposed to extend directly to the first and second conductive vias from one doped region of the bi-directional Zener diode, respectively.

3. The light emitting device package of claim 1, wherein the bi-directional Zener diode region is positioned to be spaced apart from the first and second conductive vias.

4. The light emitting device package of claim 1, wherein the bi-directional Zener diode region is positioned between the first and second conductive vias.

5. The light emitting device package of claim 1, wherein the light emitting device is bonded to the first and second surface electrodes through flip-chip bonding.

6. The light emitting device package of claim 1, wherein the light emitting device is disposed within the recess portion, and the recess portion is filled with a light-transmissive resin.

7. The light emitting device package of claim 6, wherein the light-transmissive resin includes a wavelength conversion material for converting a wavelength of light emitted from the light emitting device.

8. The light emitting device package of claim 1, wherein the bi-directional Zener diode is formed as a region of the second surface of the undoped semiconductor substrate that is doped to have a first type of conductivity and both sides in contact with the doped region are doped to have a second type of conductivity.

9. The light emitting device package of claim 8, wherein both electrodes of the light emitting device are electrically connected to the regions of the bi-directional Zener diode doped to have the second type of conductivity.

10. The light emitting device package of claim 1, wherein the bi-directional Zener diode is an npn or pnp Zener diode.

11. The light emitting device package of claim 1, wherein the first and second surface electrodes extending along the side walls of the recess portion are formed of a light reflective material for reflecting light emitted by the light emitting device upwardly from the first surface.

12. The light emitting device package of claim 11, wherein each of the first and second surface electrodes are formed of two or more layers so as to enhance light reflection efficiency.

13. The light emitting device package of claim 1, wherein the first and second surface electrodes further extend along the first surface of the undoped semiconductor substrate outside of the recess portion.

14. The light emitting device package of claim 1, wherein the first and second external electrodes are disposed directly on the second surface of the undoped semiconductor substrate.

* * * * *